(12) United States Patent
Kim et al.

(10) Patent No.: US 7,905,618 B2
(45) Date of Patent: Mar. 15, 2011

(54) BACKLIGHT UNIT

(75) Inventors: Dae Yeon Kim, Gyeonggi-do (KR); Young June Jeong, Seoul (KR); Hun Joo Hahm, Gyeonggi-do (KR); Jae Hong Shin, Gyeonggi-do (KR); Chang Ho Shin, Gyeonggi-do (KR)

(73) Assignee: Samsung LED Co., Ltd., Suwon-si (KR)

( * ) Notice: Subject to any disclaimer, the term of this patent is extended or adjusted under 35 U.S.C. 154(b) by 0 days.

(21) Appl. No.: 12/175,952

(22) Filed: Jul. 18, 2008

(65) Prior Publication Data

US 2009/0021932 A1 Jan. 22, 2009

(30) Foreign Application Priority Data

Jul. 19, 2007 (KR) .......... 10-2007-0072266
Jul. 16, 2008 (KR) .......... 10-2008-0069033

(51) Int. Cl.
G09F 13/04 (2006.01)

(52) U.S. Cl. ... 362/97.3; 362/218; 362/231; 362/249.02; 362/294

(58) Field of Classification Search ............. 362/97.3, 362/231, 249.02, 612, 218, 294, 373, 800
See application file for complete search history.

(56) References Cited

U.S. PATENT DOCUMENTS

| 7,125,137 | B2 | 10/2006 | Kitajima et al. | |
|---|---|---|---|---|
| 7,172,325 | B2 | 2/2007 | Kim et al. | |
| 7,467,877 | B2 * | 12/2008 | Peng et al. | 362/249.16 |
| 7,566,143 | B2 * | 7/2009 | Furukawa et al. | 362/231 |
| 7,568,826 | B2 * | 8/2009 | Hamada et al. | 362/612 |
| 7,648,254 | B2 | 1/2010 | Yoo et al. | |
| 2007/0014098 | A1 | 1/2007 | Park et al. | |
| 2007/0189011 | A1 * | 8/2007 | Song et al. | 362/294 |
| 2007/0242459 | A1 | 10/2007 | Nishigaki | |
| 2007/0258266 | A1 * | 11/2007 | Baek et al. | 362/612 |
| 2007/0263408 | A1 * | 11/2007 | Chua | 362/612 |
| 2008/0025019 | A1 * | 1/2008 | Kim | 362/231 |
| 2008/0116468 | A1 | 5/2008 | Radkov et al. | |
| 2008/0151143 | A1 | 6/2008 | Li et al. | |
| 2009/0140630 | A1 | 6/2009 | Kijima et al. | |

FOREIGN PATENT DOCUMENTS

| CN | 2807292 Y | 8/2006 |
|---|---|---|
| CN | 1844984 A | 10/2006 |
| EP | 1 717 633 A1 | 11/2006 |

OTHER PUBLICATIONS

Chinese Office Action, w/ English translation thereof, issued in Chinese Patent Application No. CN 200810129908.7 dated Nov. 20, 2009.
United States Office Action issued in U.S. Appl. No. 12/400,317 dated Oct. 13, 2009.
USPTO Office Action issued on Dec. 9, 2010 in counterpart U.S. Appl. No. 12/400,317.

* cited by examiner

Primary Examiner — Stephen F Husar
(74) Attorney, Agent, or Firm — Sughrue Mion, PLLC

(57) ABSTRACT

Provided is a backlight unit including a plurality of light emitting diodes (LEDs) that emit light; a plurality of LED modules having a printed circuit board (PCB) which supports and drives the plurality of LEDs; a plurality of optical sheets that are attached to the top surfaces of the respective LED modules; and a plurality of heat radiating pads that are attached to the rear surfaces of the respective LED modules.

22 Claims, 7 Drawing Sheets

[FIG. 1]
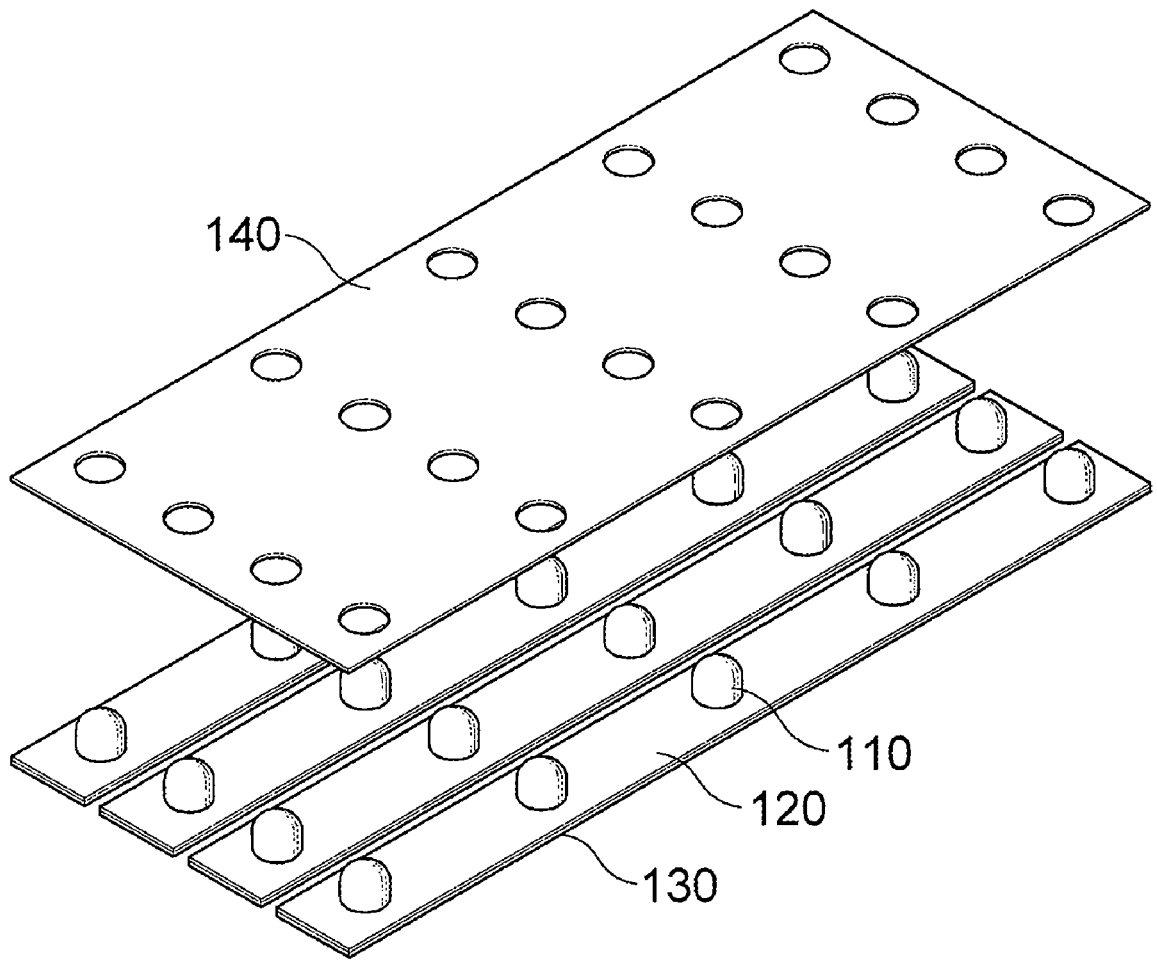
- Prior Art

[FIG. 2A]
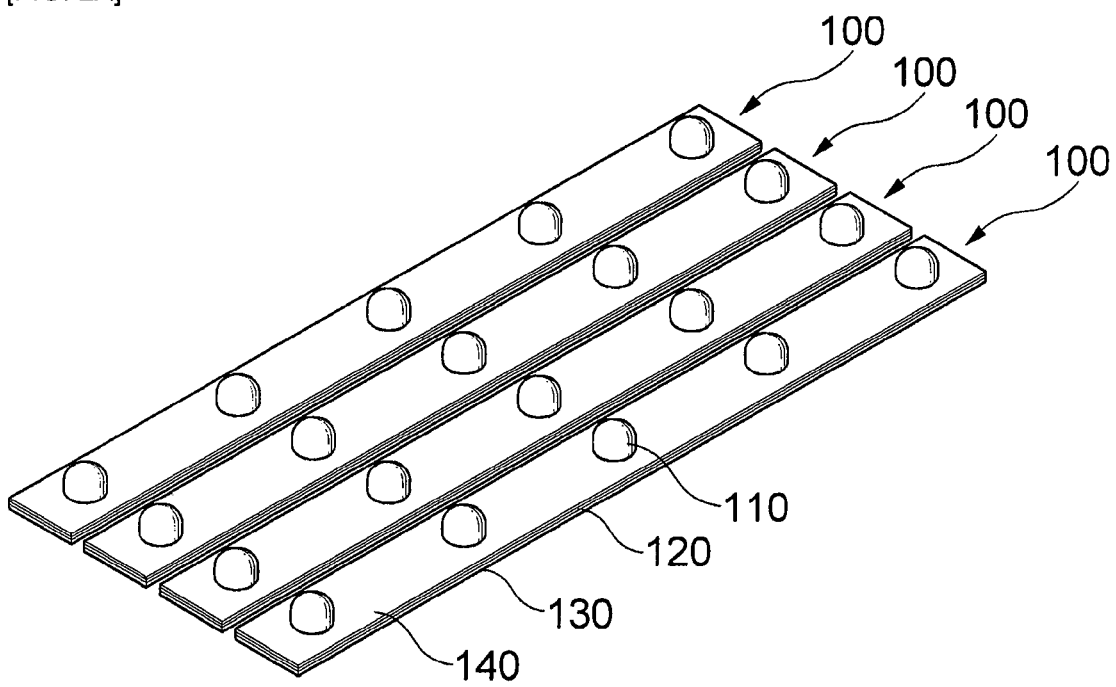
[FIG. 2B]
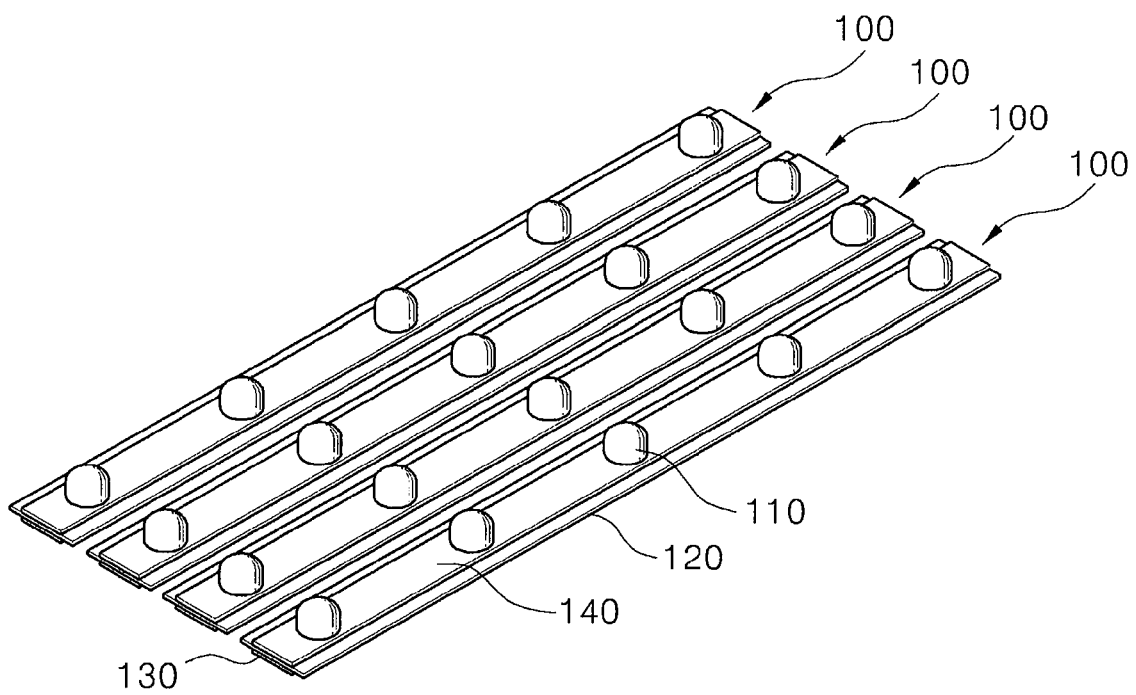

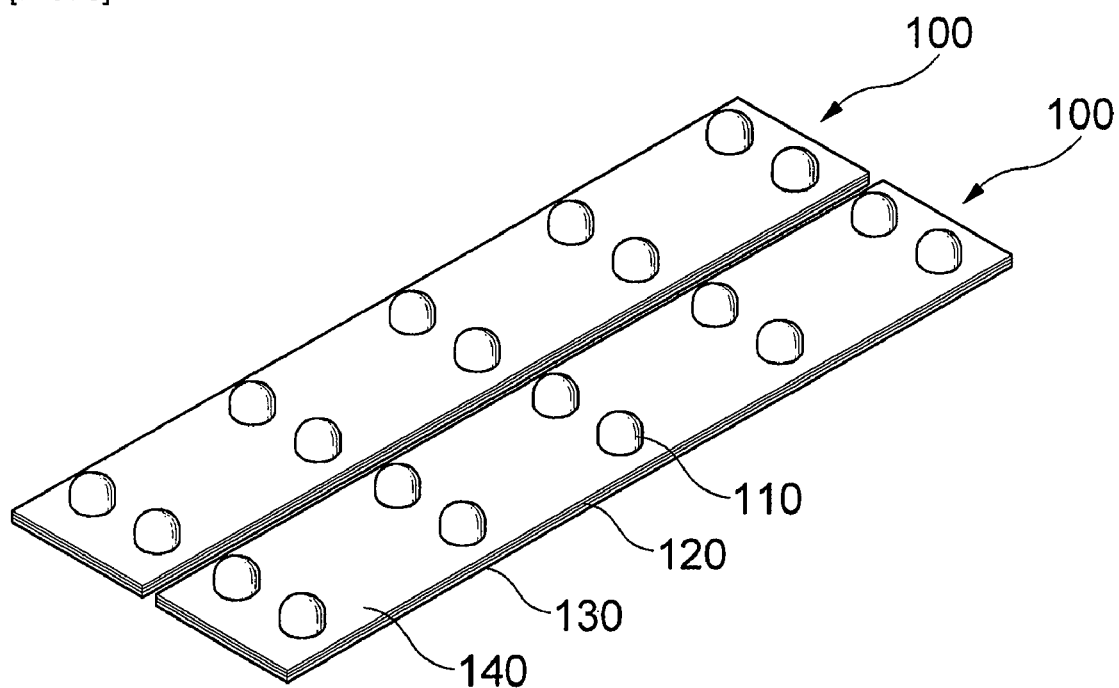
[FIG. 3]

[FIG. 4]
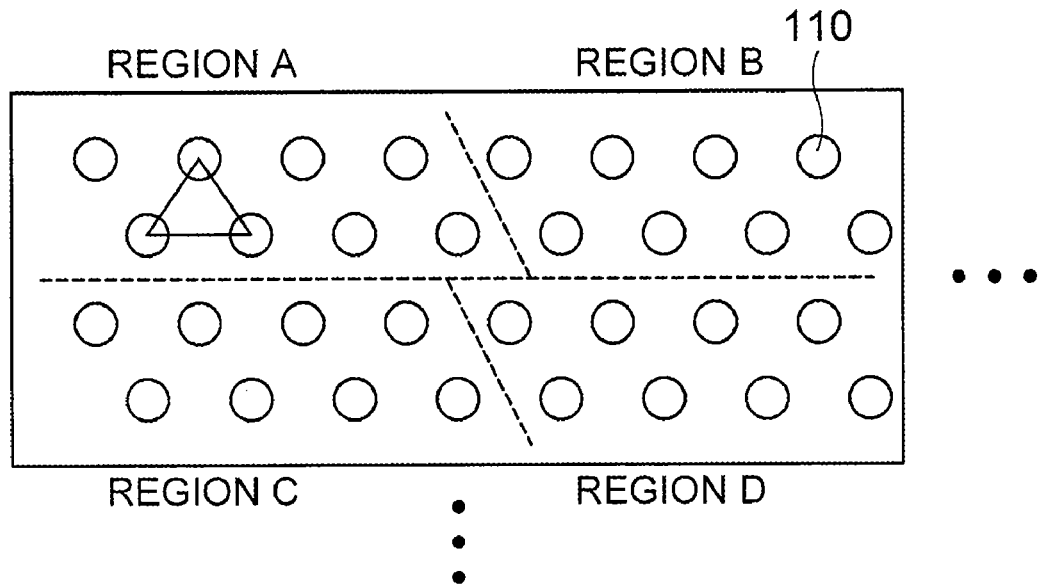
[FIG. 5]
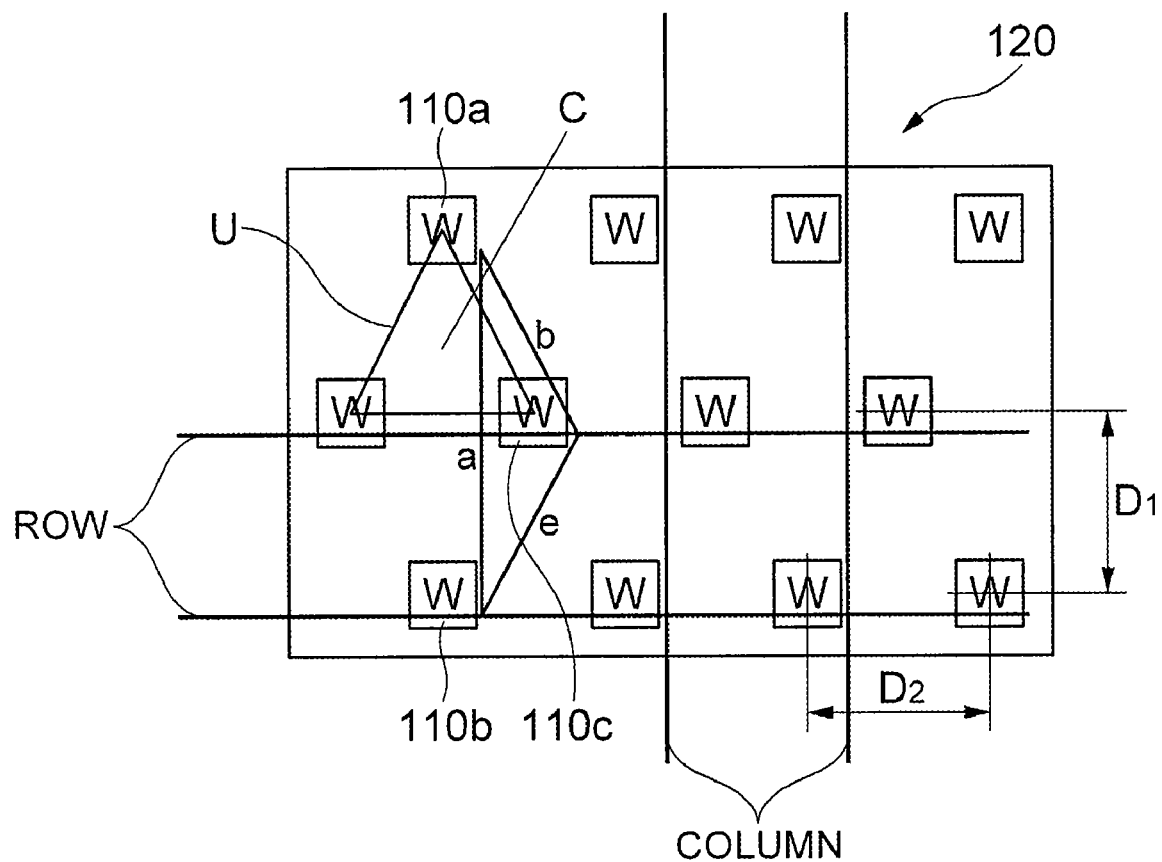

[FIG. 6]
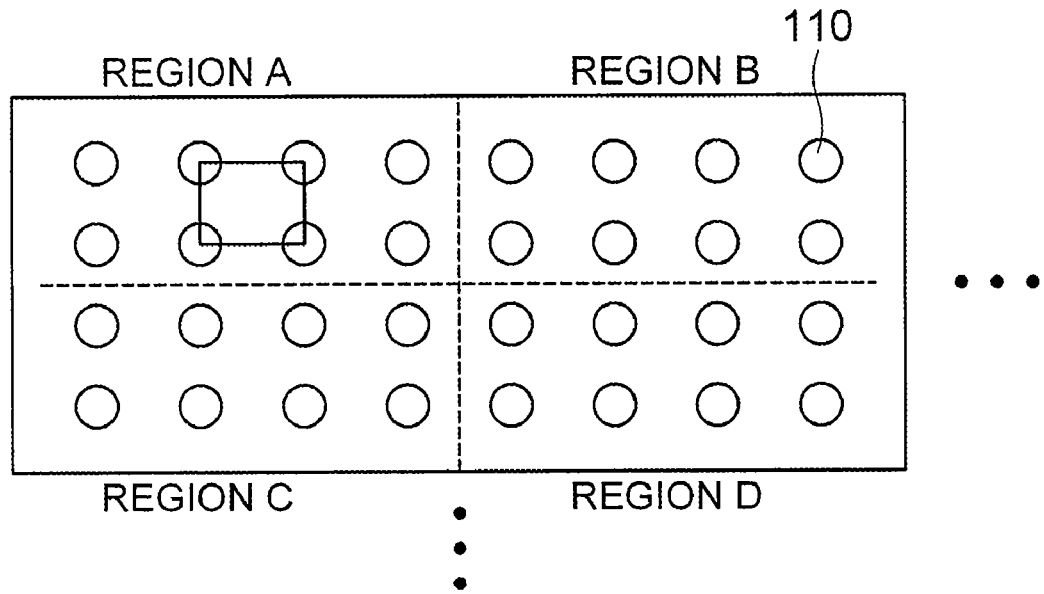
[FIG. 7]
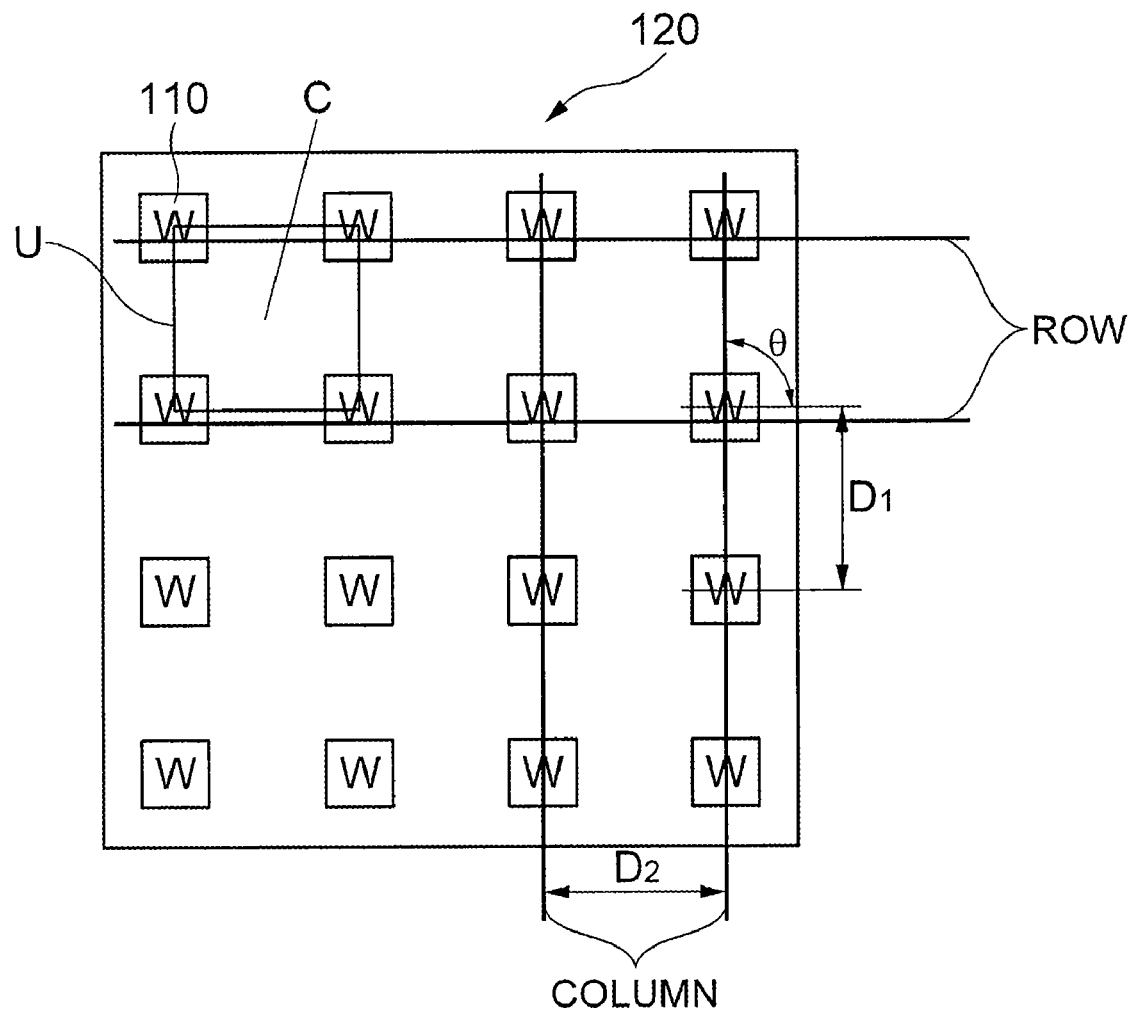

[FIG. 8]
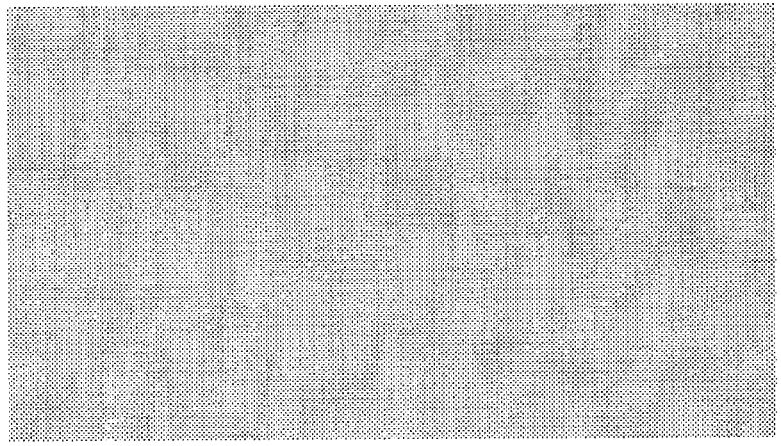
[FIG. 9]
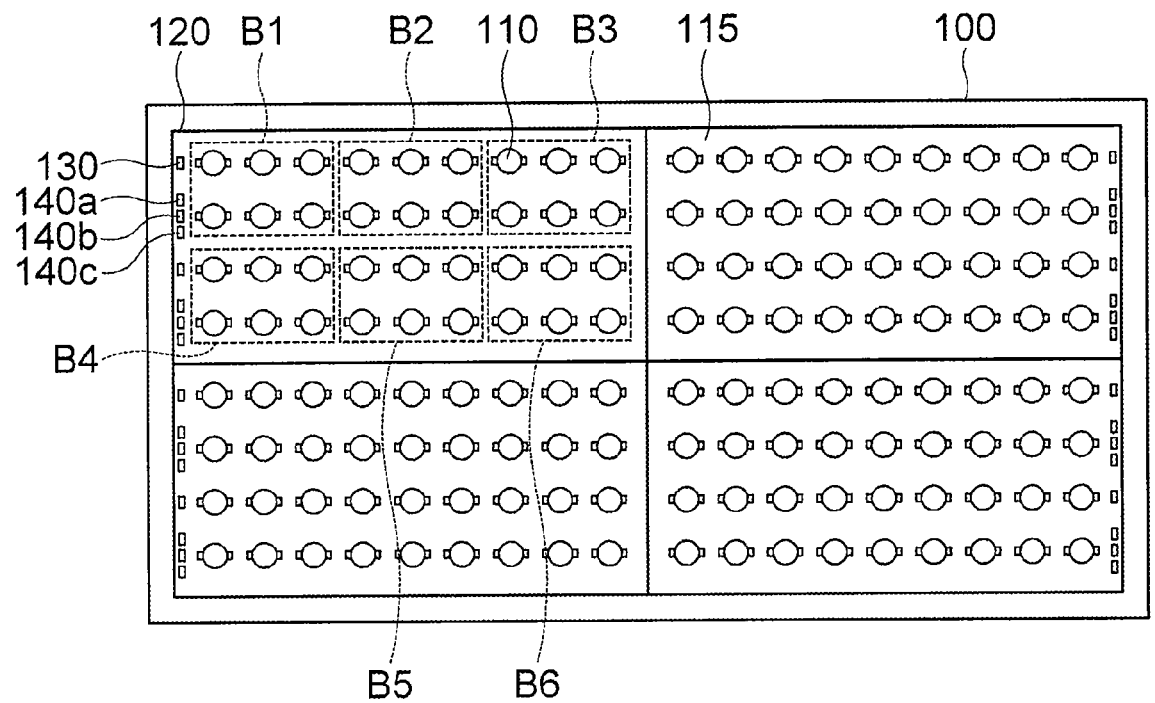

[FIG. 10]
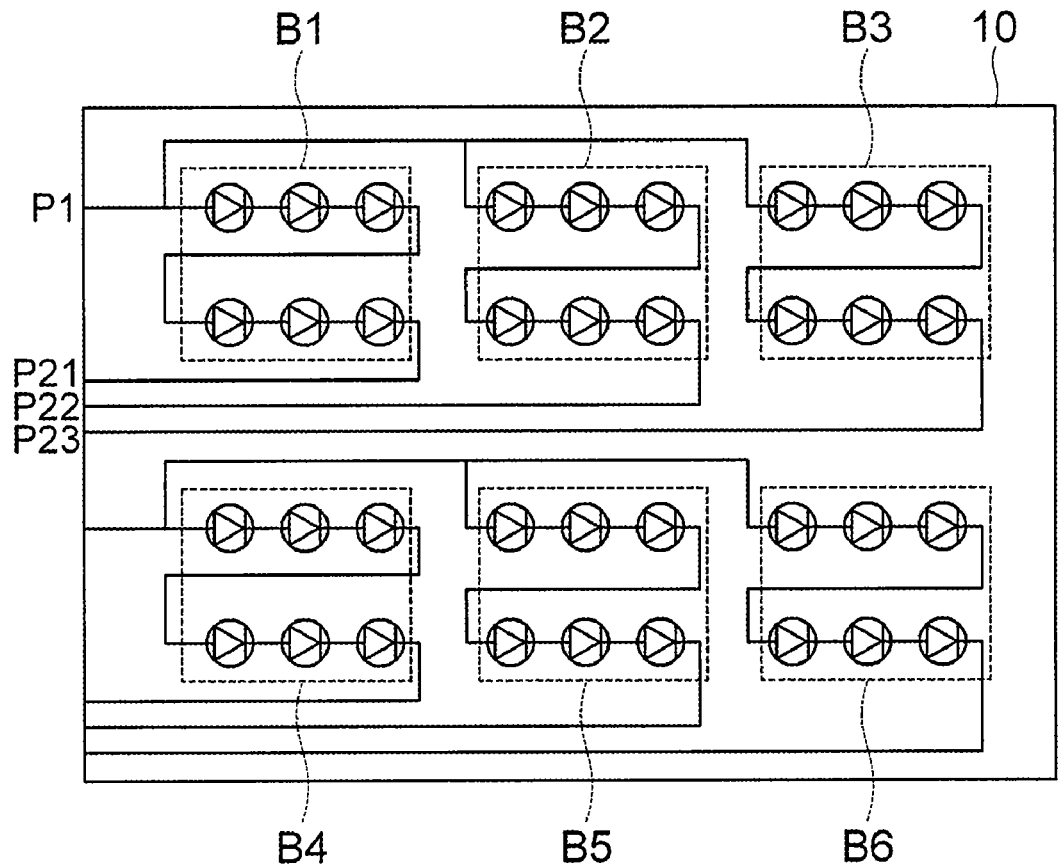
[FIG. 11]
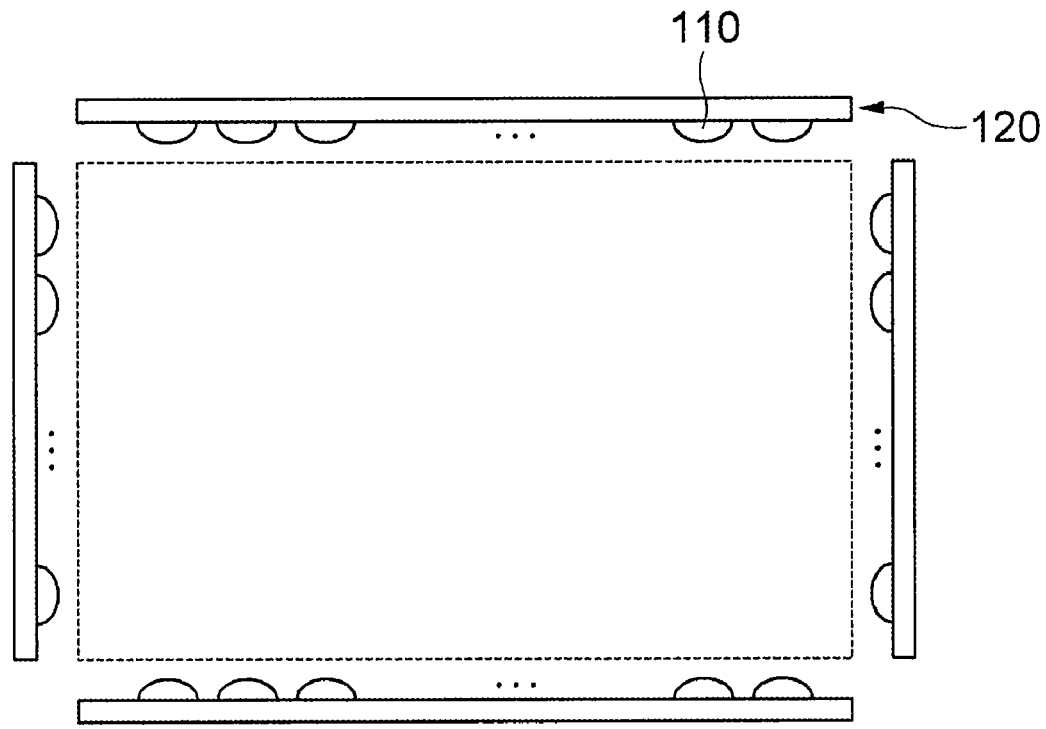

BACKLIGHT UNIT

CROSS-REFERENCE TO RELATED APPLICATIONS

This application claims the benefit of Korean Patent Application Nos. 10-2007-0072266 and 10-2008-0069033 filed with the Korea Intellectual Property Office on Jul. 19, 2007 and Jul. 16, 2008, the disclosure of which is incorporated herein by reference.

BACKGROUND OF THE INVENTION

1. Field of the Invention

The present invention relates to a backlight unit which uses light emitting diode (LED) modules.

2. Description of the Related Art

Recently, with the rapid development of semiconductor technology, the performance of products is further enhanced while the size and weight thereof is reduced. Cathode ray tubes (CRT), which are still used for information display devices, have many advantages in terms of performance and price, but have a limit in miniaturization and portability. As a device for overcoming such a disadvantage, a liquid crystal display (LCD) device has been proposed. Since the LCD device can be reduced in size and weight and has low power consumption, the LCD device is being recognized as a substitute which can overcome the disadvantages of CRT. Currently, almost every information processing equipment requiring a display device includes the LCD device mounted thereon.

In the LCD device, a voltage is applied to a specific molecular arrangement of liquid crystal such that the molecular arrangement is converted into another molecular arrangement, and changes in optical characteristics of a liquid crystal cell, which emits light through the converted molecular arrangement, such as birefringence, rotatory power, two-color property, and diffusion, are converted into visual changes. That is, the LCD device is such a display device that uses the modulation of light by the liquid crystal cell.

Since the LCD device is a passive element which cannot emit light for itself, a backlight unit attached to the rear surface of a liquid crystal panel is used to illuminate the liquid crystal panel. The light transmittance of the liquid crystal panel is adjusted by an applied electrical signal, and still or moving images are displayed on the liquid crystal panel.

As for a lamp used in the backlight unit which supplies light to the liquid crystal panel, a cold cathode fluorescent lamp (CCFL) has been widely used. Recently, however, a backlight unit using LEDs are frequently used for a variety of display devices such as a portable device and a field sequential color LCD device.

Referring to FIG. 1, a conventional backlight unit using LEDs will be described in detail.

FIG. 1 is a perspective view of a conventional backlight unit.

As shown in FIG. 1, the conventional backlight unit is positioned under a display panel (not shown) and includes a plurality of LEDs 110, a plurality of LED modules 120 having a printed circuit board (PCB) which supports and drives the plurality of LEDs 110, an optical sheet 140 which is provided above the plurality of LED modules 120 so as to be spaced at a predetermined distance from the LED modules 120, and a heat radiating pad 130 which is provided on the rear surface of the LED modules 120.

The conventional backlight unit is constructed in such a manner that the optical sheet 140 disposed above the plurality of LED modules 120 is spaced at a predetermined distance from the LED modules 120, and one optical sheet 140 covers all the LED modules 120. In this case, the heat radiating pad 130 on the rear surface of the LED modules 180 may be divided in accordance with the number of LED modules 120 so as to be individually attached to each of the LED modules 120, or one heat radiating pad 130 may be attached so as to cover the overall LED modules 120.

However, when the optical sheet of the backlight unit is formed so as to be spaced from the LED modules, there are difficulties in achieving a reduction in size and thickness of a display device using the backlight unit.

Further, when the optical sheet for controlling light orientation is received and fixed as one sheet which covers the overall LED modules, the optical sheet above the LED modules should be entirely removed if any one of the LED modules is damaged. Therefore, a rework process of the backlight unit becomes complicated.

SUMMARY OF THE INVENTION

An advantage of the present invention is that it provides a backlight unit in which an LED module, an optical sheet positioned above the LED module, and a heat radiating pad positioned under the LED module are integrally formed, thereby reducing the size and thickness of the backlight unit.

Additional aspects and advantages of the present general inventive concept will be set forth in part in the description which follows and, in part, will be obvious from the description, or may be learned by practice of the general inventive concept.

According to an aspect of the invention, a backlight unit comprises a plurality of light emitting diodes (LEDs) that emit light; a plurality of LED modules having a printed circuit board (PCB) which supports and drives the plurality of LEDs; a plurality of optical sheets that are attached to the top surfaces of the respective LED modules; and a plurality of heat radiating pads that are attached to the rear surfaces of the respective LED modules.

The optical sheet, and the heat radiating pad may be formed to have the same size.

The optical sheet and the heat radiating pad may have a smaller size than the LED module.

The LED modules may be arranged in parallel to each other in the longitudinal direction thereof.

The LED modules may be arranged so as to surround a predetermined region.

The plurality of LEDs may be continuously arranged in a triangle or rectangle shape.

The plurality of LEDs may be separated for each block in a circuit manner such that some LEDs among the plurality of LEDs can be partially turned on/off.

According to an aspect of the invention, a backlight unit comprises a plurality of LED modules having a plurality of LEDs that emit light and a printed circuit board (PCB) which supports and drives the plurality of LEDs, wherein the plurality of LED modules include a plurality of white LEDs arranged in a matrix shape composed of two or more rows and two or more columns and a center luminous intensity of an LED unit composed of arbitrary LEDs which are disposed at the shortest distance from each other corresponds to 80 to 120% of the average of luminous intensities of the LEDs.

The plurality of LEDs may be continuously arranged in a triangle shape and a distance between first and second LEDs, which are disposed in the same column and are adjacent to each other, is set in the range of 20 to 140 mm.

The plurality of LEDs may be continuously arranged in a triangle shape and a distance between LEDs which are adjacent to each other in a row or column direction is set in the range of 8.2 to 70 mm.

The plurality of LEDs may be continuously arranged in a rectangle shape and distances between LEDs, which are adjacent to each other, are set in the range of 8.2 to 70 mm.

The plurality of LEDs may be continuously arranged in a rectangle shape and an angle between the column direction where the LEDs are arranged and a position where the LED is disposed is formed in the range of 70 to 110 degrees.

The plurality of LED modules may be divided into a plurality of blocks which are separated from each other through printing circuit patterns in a circuit manner so as to be independently turned on/off.

According to an aspect of the invention, a backlight unit comprises a plurality of LEDs that emit white light; and a plurality of LED modules having a printed circuit board (PCB) which supports and drives the plurality of LEDs, wherein distances between LEDs, which are adjacent to each other, are set in the range of 8.2 to 70 mm and the plurality of LED modules are arranged to surround a predetermined region of a central part.

According to an aspect of the invention, a backlight unit comprises a plurality of LEDs that emit white light; and a plurality of LED modules having a printed circuit board (PCB) which supports and drives the plurality of LEDs, wherein the plurality of LEDs include; an LED chip having a dominant wavelength of 420-456 nm; red phosphors which are disposed around the LED chip and are excited by the LED chip so as to emit red light; and green phosphors which are disposed around the LED chip and are excited by the LED chip so as to emit green light, and wherein the plurality of LED modules are at least four or more in number and are arranged so as to surround a predetermined region.

The red phosphors may include a nitride-based red phosphor.

The red phosphors may include a nitride-based $CaAlSiN_3$:Eu red phosphor.

The green phosphors may include any one of a silicate-based green phosphor and a nitride-based green phosphor.

The green phosphor may include any one of a silicate-based green phosphor having a composition of $A_2SiO_4$ or $A_3SiO_5$, a nitride-based green phosphor having a composition of Beta-SiAlON, wherein A may be Sr, Ba, Ca, and Mg, and Sr is an essential element, and Ba, Ca, and Mg are selectively included, if necessary, and are satisfied by $0 \leq$ sum of composition of Ba, Ca, $Mg \leq 1$.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a perspective view of a conventional backlight unit;

FIG. 2A and FIG. 2B are perspective views of backlight units according to the invention;

FIG. 3 is a perspective view showing the arrangement of a plurality of LEDs in a backlight unit according to a first embodiment of the invention;

FIG. 4 is a plan view showing the arrangement of a plurality of blocks in a backlight unit according to a second embodiment of the invention;

FIG. 5 is a plan view showing the arrangement of a plurality of LEDs in the backlight unit according to the second embodiment of the invention;

FIG. 6 is a plan view showing the arrangement of a plurality of blocks in a backlight unit according to a third embodiment of the invention;

FIG. 7 is a plan view showing the arrangement of a plurality of LEDs in the backlight unit according to the third embodiment of the invention;

FIG. 8 is an image showing the brightness of the backlight unit according to the invention;

FIG. 9 is a plan view of the backlight unit according to the invention;

FIG. 10 is a circuit diagram of the backlight unit according to the invention; and FIG. 11 is a perspective view showing another example for the arrangement of LED modules in the backlight unit according to the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a backlight unit according to the present invention will be described in detail with reference to the accompanying drawings.

FIG. 2A is a perspective view of a backlight unit according to an embodiment of the invention.

As shown in FIG. 2A, the backlight unit 100 according to the embodiment of the invention is positioned under a display device (not shown) and includes a plurality of LEDs 110 which emit light, a plurality of LED modules 120 having a printed circuit board (PCB) which supports and drives the plurality of LEDs 110, a plurality of optical sheets 140 which are attached to the top surfaces of the respective LED modules 120, and a plurality of heat radiating pads 130 which are attached to the rear surfaces of the respective LED modules 120.

The plurality of LEDs 110 can implement white light. For example, the plurality of LEDs 110 may include blue LED chips and red and green phosphors disposed on the blue LED chips. Alternately, the plurality of LEDs 110 may include blue LED chips, red LED chips, and green LED chips. In this case, the blue LED chips include LED chips having an emission wavelength of 250 to 420 nm and blue phosphors disposed on the LED chips. Further, the red and green LED chips include red and green phosphors disposed on LED chips having an emission wavelength of 250 to 420 nm.

As for a material used as the red phosphor, nitride-based $CaAlSiN_3$:Eu, sulfide-based (Ca, Sr)S:Eu and so on may be exemplified.

As for a material used as the green phosphor, silicate-based $A_2SiO_4$ having a composition of 2, 1, 4, silicate-based $A_3SiO_5$ having a composition of 3,1,5, sulfide-based $SrGa_2S_4$:Eu, and nitride-based Beta-SiAlON may be exemplified. As for the silicate-based phosphor having a composition of 2, 1, 4, (Sr,Ba,Ca,Mg)2SiO4:Eu,X may be used. In this case, Sr is an essential element, and Ba, Ca, and Mg may be selectively included ($0 \leq$ sum of composition of Ba,Ca,$Mg \leq 1$), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm. Further, as for the silicate-based phosphor having a composition of 3,1,5, (Sr, Ba,C,Mg)3SiO5:Eu,X may be used. In this case, Sr is an essential element, and Ba, Ca, and Mg may be selectively included (0≦sum of composition of Ba,Ca,Mg≦1), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm.

As for a material used as the blue phosphor, a silicate-based material, a sulfide-based material, a nitride-based material, and an aluminate-based material may be exemplified.

The plurality of LED modules 120 include a plurality of LEDs 110 arranged in a matrix shape composed of m rows and n columns. In this case, the plurality of LEDs 110 arranged in a m×n matrix may be divided into a plurality of blocks. Here, m and n are positive numbers equal to or more than 2.

Each of the LED modules 120 includes a plurality of blocks. In this case, the plurality of LEDs 110 may be divided for each block so as to be separately driven.

As such, the backlight unit 100 can be divided and driven for each block.

Further, as any one of the number of LED modules, the number of blocks included in the LED module, and the number of LED chips for each block is properly adjusted, luminous intensity required for the backlight unit can be properly adjusted.

Specifically, the selection of the proper number of LEDs, the number of LED modules, the number of blocks for each LED module, and the number of LED chips for each block depending on the size of the backlight unit will be described.

In this embodiment, backlight units having a size of 40, 46, 52, and 57 inches, respectively, are exemplified.

First, the total luminous intensity (lumens) required for each backlight unit size may be set to 7000, 8000, 93000, and 13000. The number of LED chips which can satisfy the total luminous intensity can be determined depending on the luminous intensity of a unit LED, as shown in Table 1.

In general, 4, 8, 10, and 15 lumens LEDs are used. Table 1 shows the number of LEDs required for each backlight unit size.

TABLE 1

| Backlight unit size (inch) | | 40 | 46 | 52 | 57 |
|---|---|---|---|---|---|
| Total luminous intensity (lumens) | | 7000 | 8000 | 9300 | 13000 |
| Number of LEDs depending on luminous intensity of unit LED | 4 lumens LED | 1750 | 2000 | 2325 | 3250 |
| | 8 lumens LED | 875 | 1000 | 1162 | 1625 |
| | 10 lumens LED | 700 | 800 | 930 | 1300 |
| | 15 lumens LED | 466 | 533 | 622 | 866 |

As shown in Table 1, the number of LEDs required depending on the luminous intensity of the unit LED may slightly differ. Such a large number of LEDs need to be properly arranged in consideration of color uniformity and brightness, so as to have optical density.

To easily implement the arrangement for the area and number, the number of LED modules, the number of blocks for each module, and the number of LEDs for each block are properly selected so as to obtain optimal brightness and color uniformity.

To satisfy the condition shown in Table 1, the number of LED modules, the number of blocks for each module, and the number of LEDs for each block in each backlight unit size may be selected as shown in Table 2.

TABLE 2

| Backlight unit size (inch) | 40 | 46 | 52 | 57 |
|---|---|---|---|---|
| Number of LEDs | 466-1750 | 533-2000 | 622-2325 | 866-3250 |
| Number of LED modules | 6-12 | 6-12 | 6-12 | 6-20 |
| Number of blocks for each module | 4-14 | 5-15 | 6-28 | 6-28 |
| Number of LEDs for each block | 6-24 | 6-24 | 6-24 | 6-24 |

In the case of 40 inch and 46 inch corresponding to the middle size, the number of LED modules and the number of LEDs for each block can be selected in the same range. In the case of 40 inch, the backlight unit may be constructed in such a manner that the LED module is divided into 4-14 blocks. In the case of 46 inch, the backlight unit may be constructed in such a manner that the LED module is divided into 5-15 blocks. If necessary, the number of modules and the number of LEDs for each block may be properly selected within the range shown in Table 2.

In the case of 52 inch and 57 inch corresponding to the large size, the number of blocks for each module may be selected in the range of 6-28, and the number of LEDs for each block may be selected in the range of 6-24. Preferably, in the case of 52 inch, the number of LED modules may be selected in the range of 6-12. In the case of 57 inch, the number of LED modules may be selected in the range of 6-20.

That is, the number of LED modules may be selected in the range of 2-28, and each of the modules may be composed of 1 to 28 blocks. Further, 2 to 240 LEDs may be arranged in each of the blocks.

In this embodiment, the number of LED modules, the number of blocks, and the number of LEDs are not limited thereto.

Each of the optical sheets 140 has a plurality of light transmission holes (not shown) corresponding to the respective LEDs 100, and serves to diffuse or reflect incident light in a predetermined direction such that light generated from the LEDs 110 can be functionally diffused or irradiated toward the display device.

The optical sheet 140 is formed to have the same size of one LED module 120 among the plurality of LED modules 120, and is individually attached to each of the LED modules 120.

Accordingly, the optical sheet 140 and the LED module 120 can be integrally formed, which makes it possible to reduce the size and thickness of the backlight unit 100.

It has been described in this embodiment that the sizes of the optical sheet 140 and the heat radiating pad 130 are equal to that of the LED module. Without being limited thereto, as illustrated in FIG. 2B, the sizes of the optical sheet 140 and the heat radiating pad 130 may be smaller than that of the LED module.

Since the optical sheet 140 is individually attached to each of the LED modules 120, only the optical sheet 140 attached to a damaged LED module 120 among the plurality of LED modules 120 is selectively removed so as to replace or repair the damaged LED module 120, which makes it possible to facilitate the subsequent process such as the rework process of the backlight unit 100.

The heat radiating pad 130 serves to radiate heat generated from the LED module 120 and may be formed of a heat radiating plate composed of synthetic resin or glass or a metal plate with high heat conductivity. If necessary, the heat radiating pad 130 on the bottom surface of the LED module 120 may be removed, in case where a small amount of heat is generated.

The optical sheet 140, the LED module 120, and the heat radiating pad 130 are integrally formed, thereby achieving a reduction in size and thickness of the backlight unit 100. Further, the optical sheet 140 is individually attached on each of the LED modules 120, which makes it possible to easily rework the backlight unit 100.

Further, the number of LED modules having optimal brightness and color uniformity, the number of blocks for each LED module, and the number of LEDs can be properly selected, which makes it possible to properly select the number of the optical sheets and the heat radiating pads.

In this embodiment, it has been described that the optical sheets 140 are separated for each block. Like the optical sheets 140, reflecting sheets may be separated for each block.

As shown in FIG. 2, the plurality of LEDs are arranged in one line on one LED module 120 among the plurality of LED modules 120. Without being limited thereto, however, the plurality of LEDs may be arranged in various shapes depending on the characteristic of the backlight unit.

Hereinafter, a variety of examples for the arrangement of the LEDs disposed in the LED module 120 will be described with reference the drawings.

FIG. 3 is a perspective view showing the arrangement of a plurality of LEDs in a backlight unit according to a first embodiment of the invention.

As shown in FIG. 3, the plurality of LEDs 110 may be arranged in two lines on one LED module 120. That is, the plurality of LEDs 110 may be arranged in one or more lines on one LED module 120 depending on the characteristic of the backlight unit.

FIG. 4 is a plan view showing the arrangement of a plurality of blocks in a backlight unit according to a second embodiment of the invention.

FIG. 5 is a plan view showing the arrangement of a plurality of LEDs in the backlight unit according to the second embodiment of the invention.

As shown in FIG. 4, a plurality of LEDs 110 may be continuously arranged on the LED module 120 so as to have a triangle shape. The plurality of LEDs 110 may be divided into a plurality of blocks A to D such that the backlight unit 100 is separately driven for each block. The respective blocks may be separated from each other so as to be independently turned on/off, and the LEDs disposed in each block are connected through printing circuit patterns. In this case, the heat radiating pad on the bottom surface of the LED module 120 may be omitted, if necessary, when a small amount of heat is generated.

By adjusting the arrangement of the LEDs, the backlight unit 100 can have optimal uniformity. As shown in FIG. 5, when the LEDs 110 implements white light, the LEDs 110 are separated from each other. In this case, the center luminous intensity C of an LED unit U composed of arbitrary LEDs, which are disposed at the shortest distance from each other, should correspond to 80 to 120% of the average of luminous intensities of the LEDs such that the backlight unit 100 has optimal uniformity.

At this time, a first distance (a) between first and second LEDs 110a and 110b, which are disposed in the same column and are adjacent to each other, may be set in the range of 20 to 140 mm. Further, second and third distances (b) and (e) between the first and second LEDs 110a and 110b and a third LED 110c which is adjacent to the first and second LEDs in the row direction may be set in the range of 15 to 90 mm. In this case, the second and third distances (b) and (e) may be equal to each other such that the backlight unit 100 has optimal uniformity. The first distance (a) should be larger than the second and third distances (b) and (e).

Further, the distance between the first and third LEDs 110a and 110c which are adjacent to each other in the column direction and the distance between the second and third LEDs 110b and 110c which are adjacent to each other in the row direction may be set in the range of 8.2 to 70 mm.

FIG. 6 is a plan view showing the arrangement of a plurality of blocks in a backlight unit according to a third embodiment of the invention.

FIG. 7 is a plan view showing the arrangement of a plurality of LEDs in the backlight unit according to the third embodiment of the invention.

As shown in FIG. 6, the plurality of LEDs 110 on the LED module 120 may be continuously arranged in a square or rectangle, for example. The plurality of LEDs 110 may be divided into a plurality of blocks A to D such that the backlight unit is separately driven for each block. The respective blocks may be separated from each other so as to be independently turned on/off, and the LEDs disposed in each block are connected through printing circuit patterns. In this case, the heat radiating pad on the bottom surface of the LED module 120 may be omitted, if necessary, when a small amount of heat is generated.

As shown in FIG. 7, when the plurality of LEDs are arranged in a rectangle, the center luminous intensity C of an LED unit U composed of arbitrary LEDs, which are disposed at the shortest distance from each other, should correspond to 80 to 120% of the average of luminous intensities of the LEDs. For this construction, distances D1 and D2 between the adjacent LEDs 110 may be set in the range of 8.2 to 70 mm. Further, an angle between the column direction where the LEDs 110 are arranged and the position where the LED is disposed may be formed in the range of 70 to 110 degrees.

In such an LED arrangement, the LEDs should satisfy the following condition so as to enhance color reproducibility and brightness.

To implement white light, the LED chip may include a blue LED chip having a dominant wavelength of 420-456 nm; red phosphors which are disposed around the blue LED chip and are excited by the blue LED chip so as to emit red light; and green phosphors which are disposed around the blue LED and are excited by the blue LED chip so as to emit green light. In this case, the color coordinates of the red light emitted from the red phosphors should be positioned within a region surrounded by four vertexes of (0.6448, 0.4544), (0.8079, 0.2920), (0.6427, 0.2905) and (0.4794, 0.4633) on the basis of the CIE 1931 color coordinate system, and the color coordinates of the green light emitted from the green phosphors should be positioned within a region surrounded by four vertexes of (0.1270, 0.8037), (0.4117, 0.5861), (0.4197, 0.5316), and (0.2555, 0.5030).

Preferably, the FWHM (Full Width at Half-Maximum) of an emission spectrum of the blue LED chip ranges from 10 to 30 nm, the FWHM of the green phosphors ranges from 30 to 100 nm, and the FWHM of the red phosphors ranges from 50 to 200 nm. Accordingly, it is possible to obtain white light with more excellent color uniformity and quality. In particular, as the dominant wavelength and the FWHM of the blue LED chip are limited to 420-456 nm and 10-30 nm, respectively, it is possible to enhance the efficiency of $CaAlSiN_3:Eu$ red phosphor and $(Sr,Ba,Ca,Mg)_2SiO_4:Eu$, X green phosphor ($0 \leqq$ sum of composition of $Ba,Ca,Mg \leqq 1$).

As described above, as for a material used as the red phosphor, nitride-based $CaAlSiN_3:Eu$, sulfide-based $(Ca, Sr)S:Eu$ and so on may be exemplified.

As for a material used as the green phosphor, silicate-based $A_2SiO_4$ having a composition of 2, 1, 4, silicate-based $A_3SiO_5$ having a composition of 3,1,5, sulfide-based SrGa2S4:Eu, and nitride-based Beta-SiAlON may be exemplified. As for the silicate-based phosphor having a composition of 2, 1, 4, (Sr, Ba,Ca,Mg)2SiO4:Eu,X may be used. In this case, Sr is an essential element, and Ba, Ca, and Mg may be selectively included ((0≦sum of composition of Ba,Ca, Mg≦1), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm. Further, as for the silicate-based phosphor having a composition of 3,1,5, (Sr,Ba,C,Mg)3SiO5:Eu,X may be used. In this case, Sr is an essential element, and Ba, Ca, and Mg may be selectively included ((0≦sum of composition of Ba,Ca, Mg≦1), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm.

As for a material used as the blue phosphor, a silicate-based material, a sulfide-based material, a nitride-based material, and an aluminate-based material may be exemplified.

FIG. 8 is an image showing the brightness of the backlight unit according to the invention. As shown in FIG. 8, when the plurality of LEDs are arranged in such a manner that the center luminous intensity C of an LED unit U composed of arbitrary LEDs, which are disposed at the shortest distance from each other, corresponds to 80 to 120% of the average of luminous intensities of the LEDs, it can be found that the backlight unit has the optimal uniformity.

In the backlight unit in which the plurality of LED modules each having the plurality of LEDs are provided, the uniformity, color reproducibility, and brightness of the backlight unit can be enhanced by adjusting the shape and arrangement of the LEDs.

Hereinafter, referring to FIGS. 9 and 10, the backlight unit according to the invention will be described in more detail.

FIG. 9 is a plan view of the backlight unit according to the invention.

FIG. 10 is a circuit diagram of the backlight unit according to the invention.

Referring to FIG. 9, the backlight unit 100 according to the invention may be a backlight unit which can be separately driven for each block. For example, the backlight unit 100 may include four LED modules 120. Each of the LED modules 120 includes a wiring board 115 and a plurality of LED chips 110 mounted on the wiring board 115. The LED chips 110 may be arranged in a matrix composed of 4 rows and 9 columns.

The LED module 120 may be divided into 6 blocks B1 to B6. In this embodiment, each of the blocks B1 to B6 composing the LED module 120 means a unit which can be separately driven.

The LED chips 110 within each of the blocks B1 to B6 may be connected in series to each other. At least one end of each of the blocks B1 to B6 is connected to a separate connector such that the LED chips 110 can be separately driven for each block. To implement the connection, the wiring board 115 of the LED module 120 includes two of first connectors 130 and six of second connectors 140a, 140b, and 140c. The first and second connectors 130, 140a, 140b, and 140c serve to provide an external voltage to the LED chips 110.

On each of the LED modules 120, an optical sheet (not shown) is individually attached. Therefore, when one LED module 120 among the plurality of LED modules 120 is damaged, only the optical sheet attached on the damaged LED module 120 can be removed so as to replace or repair the damaged LED module 120, which makes it possible to easily rework the backlight unit 100.

Referring to FIG. 10, each of the first to third blocks B1 to B3 is composed of six LED chips 110 which are disposed across three columns at the first and second rows, and each of the fourth to sixth blocks B4 to B6 is composed of six LED chips 110 which are disposed across three columns at the third and fourth rows.

The LED chips of each block are connected in series to each other. In the series circuit of the first to third blocks B1 to B3, positive terminals (+) are commonly connected to a first connector P1, and negative terminals (−) are connected to three of second connectors P21 to P23, respectively, for each block. Similarly, in the series circuit of the fourth to six blocks B4 to B6, positive terminals (+) are commonly connected to the first connector, and negative terminals are connected to three of second connectors, respectively, for each block. The connectors P1 and P21 to P23 of FIG. 9 may correspond to the first and second connectors shown in FIG. 8.

As such, the backlight unit according to the invention can implement a structure which is required for the division driving for each block and can adjust the number of LED chips by the unit of three LED chips.

In the backlight unit according to the invention, the LED chips are arranged in a matrix shape composed a plurality of rows and columns so as to uniformly illuminate light, and the number of LED chips which are required for an area can be properly adjusted by adjusting the number of LED modules, the number of blocks for each LED module, and the number of LED chips for each block. Therefore, a necessary number of LED chips can be easily arranged with proper density. As a result, it is possible to effectively improve a local dimming effect and entire color uniformity in middle- and large-sized displays.

Further, as described above, the optical sheet (not shown) is individually attached on each of the LED modules 120. Therefore, when one LED module 120 among the plurality of LED modules 120 is damaged, only the optical sheet attached on the damaged LED module 120 can be removed so as to replace or repair the damaged LED module 120, which makes it possible to easily rework the backlight unit 100.

In this embodiment, it has been described that the LED modules are arranged in the longitudinal direction thereof. However, the arrangement of the LED modules is not limited thereto.

FIG. 11 is a perspective view showing another example for the arrangement of LED modules in the backlight unit according to the invention.

As shown in FIG. 11, the LED modules 120 may be arranged so as to surround a predetermined region. In FIG. 11, four LED modules are exemplified, but more than four LED modules are arranged so as to surround the region. The heat radiating pad on the bottom surface of the LED module maybe omitted, when a small amount of heat is generated.

According to the present invention, the LED module, the optical sheet positioned on the LED module, and the heat radiating pad positioned under the LED module are integrally formed, thereby reducing the size and thickness of the backlight unit.

Since the optical sheet is individually attached to each of the LED modules, only the optical sheet attached to a damaged LED module among the plurality of LED modules is selectively removed so as to replace or repair the damaged LED module, which makes it possible to facilitate the subsequent process such as the rework process.

Further, as the number of LED modules, the number of blocks for each LED module, and the number of LED for each block are set in consideration of color uniformity and brightness depending on the area of the backlight, it is possible to minimize the number of optical sheets or reflecting sheets.

Accordingly, it is possible to achieve a reduction in size and thickness of the backlight unit and to enhance a production yield of the backlight unit.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A backlight unit comprising:
a plurality of light emitting diodes (LEDs) that emit light;
a plurality of LED modules having a printed circuit board (PCB) which supports and drives the plurality of LEDs;
a plurality of optical sheets that are attached to the top surfaces of the respective LED modules; and
a plurality of heat radiating pads that are attached to the rear surfaces of the respective LED modules,
wherein the optical sheet and the heat radiating pad have the same size as the LED module or a smaller size than the LED module, and
the LED modules are arranged in parallel to each other in the longitudinal direction thereof.

2. The backlight unit according to claim 1, wherein the LED modules are arranged so as to surround a predetermined region.

3. The backlight unit according to claim 1, wherein the plurality of LEDs are continuously arranged in a triangle or rectangle shape.

4. The backlight unit according to claim 1, wherein the plurality of LEDs are separated for each block in a circuit manner such that some LEDs among the plurality of LEDs can be partially turned on/off.

5. A backlight unit comprising:
a plurality of LEDs that emit light; and
a plurality of LED modules having a printed circuit board (PCB) which supports and drives the plurality of LEDs,
wherein the plurality of LED modules include a plurality of white LEDs arranged in a matrix shape composed of two or more rows and two or more columns and a center luminous intensity of an LED unit composed of arbitrary LEDs which are disposed at the shortest distance from each other corresponds to 80 to 120% of the average of luminous intensities of the LEDs, and
the plurality of LEDs are continuously arranged in a triangle shape and a distance between first and second LEDs, which are disposed in the same column and are adjacent to each other, is set in the range of 20 to 140 mm.

6. The backlight unit according to claim 5, wherein the plurality of LED modules are divided into a plurality of blocks which are separated from each other through printing circuit patterns in a circuit manner so as to be independently turned on/off.

7. A backlight unit comprising:
a plurality of LED modules having a plurality of LEDs that emit white light and a printed circuit board (PCB) which supports and drives the plurality of LEDs,
wherein the plurality of LEDs include;
an LED chip having a dominant wavelength of 420-456 nm;
red phosphors which are disposed around the LED chip and are excited by the LED chip so as to emit red light; and
green phosphors which are disposed around the LED chip and are excited by the LED chip so as to emit green light, and
wherein the plurality of LED modules are at least four or more in number and are arranged so as to surround a predetermined region, and
the red phosphors include a nitride-based red phosphor.

8. The backlight unit of claim 7, wherein the red phosphors include a nitride-based $CaAlSiN_3:Eu$ red phosphor.

9. A backlight unit comprising:
a plurality of LED modules having a plurality of LEDs that emit white light and a printed circuit board (PCB) which supports and drives the plurality of LEDs,
wherein the plurality of LEDs include;
an LED chip having a dominant wavelength of 420-456 nm;
red phosphors which are disposed around the LED chip and are excited by the LED chip so as to emit red light; and
green phosphors which are disposed around the LED chip and are excited by the LED chip so as to emit green light, and
wherein the plurality of LED modules are at least four or more in number and are arranged so as to surround a predetermined region, and
the green phosphors include any one of silicate-based green phosphor, and a nitride-based green phosphor.

10. The backlight unit of claim 9, wherein the green phosphors include any one of a silicate-based green phosphor having a composition of $A_2SiO_4$ or $A_3SiO_5$, and a nitride-based green phosphor having a composition of Beta-SiAlON, wherein A may be Sr, Ba, Ca, and Mg, and Sr is an essential element, and Ba, Ca, and Mg are selectively included, if necessary, and are satisfied by 0<sum of composition of Ba, Ca, Mg<1.

11. A display device comprising:
a display panel; and
a backlight unit which irradiates light to the display panel,
wherein the backlight unit comprises:
a plurality of light emitting diodes (LEDs) that emit light;
a plurality of LED modules having a printed circuit board (PCB) which supports and drives the plurality of LEDs;
a plurality of optical sheets that are attached to the top surfaces of the respective LED modules; and
a plurality of heat radiating pads that are attached to the rear surfaces of the respective LED modules,
wherein the optical sheet and the heat radiating pad have the same size as the LED module or a smaller size than the LED module, and
the LED modules are arranged in parallel to each other in the longitudinal direction thereof.

12. The display device of claim 11, wherein the display panel is a liquid crystal panel.

13. The display device of claim 11, further comprising a driving circuit which drives the backlight unit.

14. A display device comprising:
a display panel; and
a backlight unit which irradiates light to the display panel,
wherein the backlight unit comprises:
a plurality of LEDs that emit light; and
a plurality of LED modules having a printed circuit board (PCB) which supports and drives the plurality of LEDs,
wherein the plurality of LED modules include a plurality of white LEDs arranged in a matrix shape composed of two or more rows and two or more columns and a center luminous intensity of an LED unit composed of arbitrary LEDs which are disposed at the shortest distance from each other corresponds to 80 to 120% of the average of luminous intensities of the LEDs, and the plurality of LEDs are continuously arranged in a triangle shape and a distance between first and second LEDs, which are disposed in the same column and are adjacent to each other, is set in the range of 20 to 140 mm.

15. The display device of claim 14, wherein the display panel is a liquid crystal panel.

16. The display device of claim 14, further comprising a driving circuit which drives the backlight unit.

17. A display device comprising:
a display panel; and
a backlight unit which irradiates light to the display panel, wherein the backlight unit comprises:
a plurality of LED modules having a plurality of LEDs that emit white light and a printed circuit board (PCB) which supports and drives the plurality of LEDs,
wherein the plurality of LEDs include:
an LED chip having a dominant wavelength of 420-456 nm;
red phosphors which are disposed around the LED chip and are excited by the LED chip so as to emit red light; and
green phosphors which are disposed around the LED chip and are excited by the LED chip so as to emit green light, and
wherein the plurality of LED modules are at least four or more in number and are arranged so as to surround a predetermined region, and
the red phosphors include a nitride-based red phosphor.

18. The display device of claim 17, wherein the display panel is a liquid crystal panel.

19. The display device of claim 17, further comprising a driving circuit which drives the backlight unit.

20. A display device comprising:
a display panel; and
a backlight unit which irradiates light to the display panel, wherein the backlight unit comprises:
a plurality of LED modules having a plurality of LEDs that emit white light and a printed circuit board (PCB) which supports and drives the plurality of LEDs,
wherein the plurality of LEDs include:
an LED chip having a dominant wavelength of 420-456 nm;
red phosphors which are disposed around the LED chip and are excited by the LED chip so as to emit red light; and
green phosphors which are disposed around the LED chip and are excited by the LED chip so as to emit green light; and
wherein the plurality of LED modules are at least four or more in number and are arranged so as to surround a predetermined region, and
the green phosphors include any one of silicate-based green phosphor and a nitride-based green phosphor.

21. The display device of claim 20, wherein the display panel is a liquid crystal panel.

22. The display device of claim 20, further comprising a driving circuit which drives the backlight unit.

* * * * *